United States Patent [19]

Yap

[11] Patent Number: 4,984,040
[45] Date of Patent: Jan. 8, 1991

[54] HIGH VOLTAGE THIN FILM TRANSISTOR WITH SECOND GATE

[75] Inventor: Peng K. Yap, San Francisco, Calif.

[73] Assignee: Xerox Corporation, Stamford, Conn.

[21] Appl. No.: 366,822

[22] Filed: Jun. 15, 1989

[51] Int. Cl.$^5$ .................. H01L 27/01; H01L 27/13; H01L 29/78; H01L 27/12

[52] U.S. Cl. .................................. 357/23.7; 357/4; 357/15; 357/23.14; 357/59; 307/304

[58] Field of Search .................. 357/23.14, 23.7, 4, 357/15, 59; 307/304

[56] References Cited

U.S. PATENT DOCUMENTS

| | | | |
|---|---|---|---|
| 4,598,305 | 7/1986 | Chiang et al. ................ | 357/23.14 |
| 4,716,446 | 12/1987 | Esser et al. ................ | 357/23.14 |
| 4,748,485 | 5/1988 | Vasudev .................... | 357/23.14 |
| 4,752,814 | 6/1988 | Tuan ....................... | 357/23.7 |
| 4,882,295 | 11/1989 | Czubatyj et al. ............ | 357/23.7 |

FOREIGN PATENT DOCUMENTS

| | | | |
|---|---|---|---|
| 0304824 | 3/1989 | European Pat. Off. ......... | 357/23.7 |
| 61-097964 | 5/1986 | Japan ....................... | 357/23.7 |
| 63-003464 | 1/1988 | Japan ....................... | 357/23.7 |

OTHER PUBLICATIONS

Marten et al., "Enhancement of Performance and Reliability of Amorphous Silicon High Voltage Thin Film Transistors by Use of Field Plates", IEDM 1989, pp. 341–364.

Dockerty, "Semiconductor Contact Hole Fabricating", IBM Technical Disclosure Bulletin, vol. 26, No. 3A, Aug. 1983.

Primary Examiner—Andrew J. James
Assistant Examiner—Daniel Y. J. Kim

[57] ABSTRACT

A high voltage thin film transistor comprises a charge transport layer, laterally disposed source and drain electrodes, a first gate electrode with one edge laterally overlapping the source electrode and another edge laterally spaced from the drain electrode. A source of high potential is continuously applied to the drain electrode and a source of low potential is applied to the first gate electrode in a time varying manner so as to form a first accumulation channel periodically in the charge transport layer, opposite to the first gate electrode. Device performance is improved by including a second gate electrode for forming a second, weaker, accumulation channel extending laterally from the region of the first accumulation channel toward the drain electrode. A source of potential is applied to the second gate electrode means for maintaining charge carriers within the second accumulation channel so as to prevent the charge transport layer from becoming depleted of charge carriers.

15 Claims, 3 Drawing Sheets

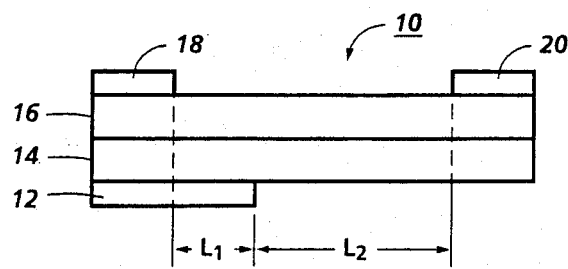
FIG. 1
FIG. 2
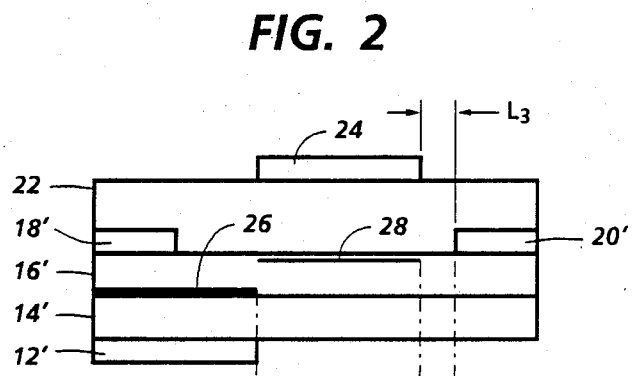
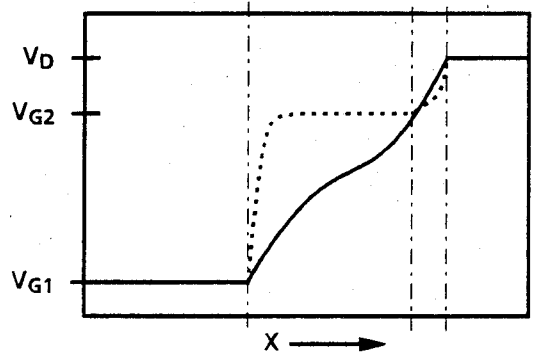
FIG. 3

HIGH VOLTAGE THIN FILM TRANSISTOR WITH SECOND GATE

FIELD OF THE INVENTION

This invention relates to a thin film high voltage transistor having a second gate for providing increased performance and stability.

BACKGROUND OF THE INVENTION

Electronic technology today relies almost exclusively on crystalline silicon with compound semiconductors, such as GaAs, occupying small, but important, niches in optoelectronic and high speed applications. Amorphous silicon device configurations have rapidly progressed in both their performance and stability since the first report in 1979 by LeComber et al (Electronic Letters 15, 179 [1979]) of an amorphous silicon field effect transistor. Amorphous silicon technology has emerged as a prime candidate for large area thin film applications, first in photovoltaic applications and later in large area integrated circuits used in flat liquid crystal displays, solid state imagers, electronic copiers, printers and scanners. This semiconductor material is ideally suited for large area arrays (in excess of 12 inches by 12 inches) because the low deposition temperatures involved in its glow discharge fabrication process, make possible the use of inexpensive substrate materials, such as glass.

By comparison to crystalline silicon devices, the main difference with amorphous silicon devices is the relatively low electron band mobility ($\leq 20$ cm$^2$/Vs) of the latter coupled with a relatively large density of localized states. This results in amorphous silicon devices having a slower switching time than single crystalline devices. However, in many large area applications, such as printing, since numerous operations can be performed in parallel, the overall system speed is quite fast. Furthermore, since amorphous silicon has a wide effective energy gap, an extremely large photoconductivity and good light sensitivity, it is uniquely suited for optoelectronic applications, particularly in the visible range.

In U.S. Pat. No. 4,752,814 (Tuan) entitled "High Voltage Thin Film Transistor", assigned to the same assignee as the present application, there is taught a unique a-Si:H transistor device which may be operated at 500 volts, or more. In operation, several hundreds of volts can be switched by a low voltage gate signal. Fabrication of this high voltage transistor is compatible with low voltage amorphous silicon TFTs. The transistor structure of this earlier patent is shown in FIG. 1 and its initial $I_{DS}$ vs. $V_{DS}$ characteristics are shown in curve A of FIG. 7. This transistor will not be stable under its standard operating conditions and, after being stressed, its characteristics will shift, as indicated by curve B of FIG. 7. Electrostatic stressing will occur on the order of minutes, in response to a history of applied voltages. The illustrated shift to higher $V_{DS}$ values is undesirable because it could degrade the performance of the HVTFT in circuit applications. In order to describe this shift, the parameter $V_x$ has been defined. It is shown in FIG. 7 as the x-axis crossing of a tangent to the inflection point of the $I_{DS}$ vs. $V_{DS}$ curve.

Therefore, it is an object of the present invention to greatly reduce the $V_x$ shift, in order to enable a high voltage thin film transistor to have more uniform operating characteristics regardless of its electrostatic stress history.

It is another object of this invention to provide a high voltage thin film transistor with an improved $V_{ON}$.

SUMMARY OF THE INVENTION

The present invention may be carried out, in one form, by providing a high voltage thin film transistor comprising a charge transport layer, laterally disposed source and drain electrodes located adjacent to the charge transport layer, a source of high electrical potential constantly applied to the drain electrode, a first gate dielectric layer located adjacent to the charge transport layer, a first gate electrode having one edge laterally overlapping the source electrode and another edge extending toward and laterally spaced from the drain electrode, and means for applying a time variable electrical potential to the first gate electrode to cycle the transistor ON as a first accumulation channel is formed in the charge transport layer, opposite to the first gate electrode. The improvement comprises second gate electrode means and means for applying an electrical potential to the second gate electrode means, so that a second accumulation channel is formed extending preventing the charge transport layer from becoming depleted of charge carriers.

BRIEF DESCRIPTION OF THE DRAWINGS

FIG. 1 illustrates a known amorphous silicon high voltage thin film transistor,

FIG. 2 illustrates one form of the present invention,

FIG. 3 illustrates the potential pattern across the transistor of FIG. 2 in the ON condition of the transistor.

DETAILED DESCRIPTION OF THE DRAWINGS

Figure 4:
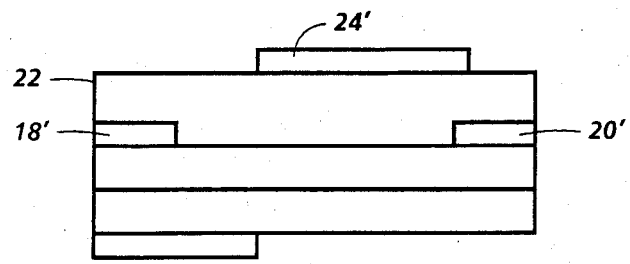
FIGS. 4 through 6 illustrate alternative forms of the present invention.

The amorphous silicon HVTFT 10 shown in FIG. 1 is supported upon a substrate (not shown) which may be a sheet of glass or other material which is readily available in large area format, and is compatible with the device fabrication temperatures, on the order of 250° C. A layer of chrome is deposited upon the substrate and is etched to form the gate electrode 12. A silicon nitride layer 14 is deposited thereover, for the gate dielectric, followed by a plasma enhanced CVD deposited charge transport layer 16 of substantially intrinsic, or lightly doped, amorphous silicon. Phosphorus doped (n-type) amorphous silicon is deposited and etched to form the source electrode 18 and drain electrode 20.

The gate electrode 12 is laterally offset from the drain electrode 20, so that the channel region in the charge transport layer includes a gated region of length $L_1$ and a "dead" (ungated) region of length $L_2$. The time varying potential applied to the gate electrode controls formation of a thin accumulation channel adjacent the interface with the gate dielectric 14. Current through this region is confined to the thin accumulation channel in the same manner as in a low voltage TFT. Because of its low conductivity, the substantially intrinsic amorphous silicon channel has low OFF current, despite the high drain voltage of several hundred volts which is dropped across the "dead" region. In normal operation, in its ON condition, electrons accumulated in the gated channel region are pulled by the drain field through the dead region and into the drain. The current through the dead region is space charge limited for drain voltages below saturation (Region I for curve A of FIG. 7) and, as such, is proportional to approximately $V^4/L_2^7$ (i.e. directly to the fourth power of the voltage and inversely to the seventh power of the dead region length).

Figure 7:
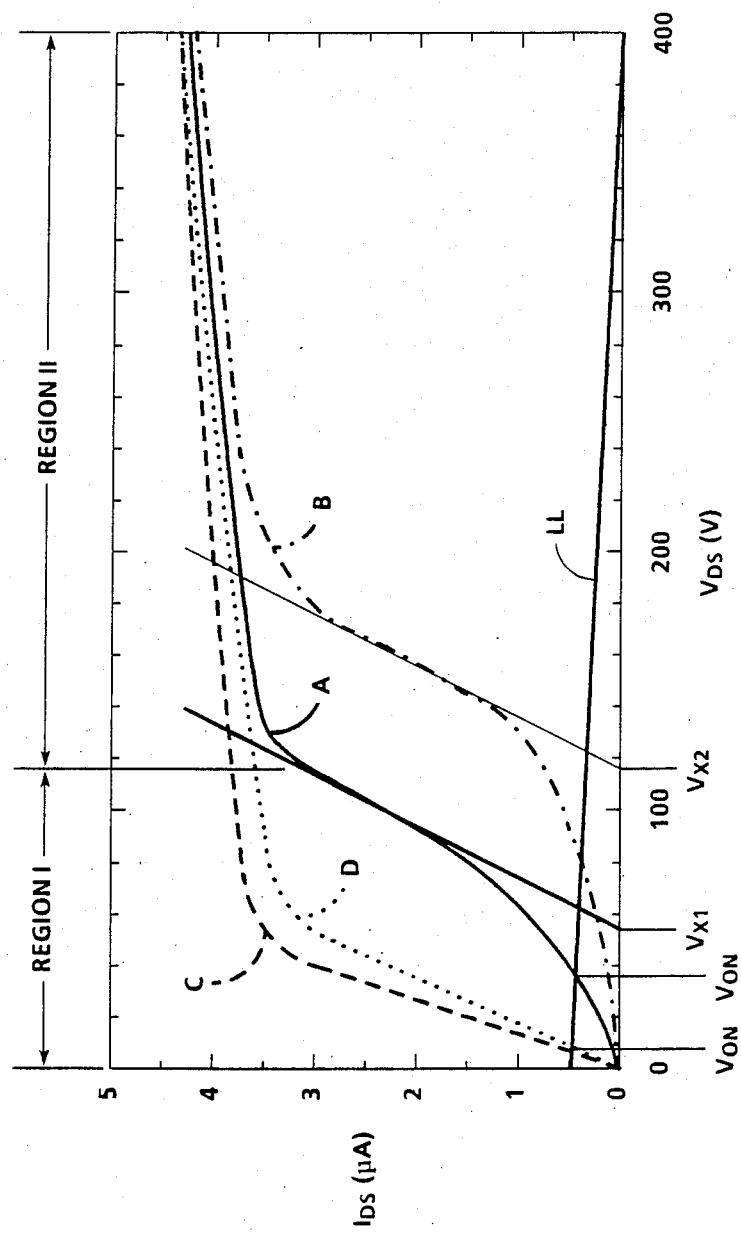
FIG. 7 illustrates the initial and post stress characteristic $I_{DS}$ vs. $V_{DS}$ curves of the HVTFT shown in FIG. 1 as well as these characteristic curve of the device of the present invention.

In FIG. 7, the $I_{DS}$ vs. $V_{DS}$ characteristic curve A of this device may be viewed as being comprised of two distinct regions. At lower drain voltages the source-to-drain current exhibits a positive curvature indicative of space charge limited current (Region I), including an initial rapid rise followed (at the point of inflection) by a decreasing rate of rise, and a saturation region (Region II) including a knee and a levelling off of the current. The physics of electron flow through the device is such that in the ON state (i.e. positive voltage applied to the gate electrode) an accumulation region of electrons is formed in a thin channel of the charge transport layer adjacent the semiconductor-insulator interface of the gated $L_1$ region. With the channel accumulated, increases in the drain voltage raise the horizontal electric field and draw increasingly more current from the accumulation region into the "dead" $L_2$ region. This condition continues until the electric field at the boundary between the gated and the "dead" regions reaches a value which saturates the current flow in the gated region in the same fashion as in a conventional low voltage TFT.

While a desirable transistor would have a $V_{ON}$ of less than 10 volts, two situations exist in the FIG. 1 type of high voltage transistor to increase this parameter, which is identified at the intersection of load line LL (for an inverter with a $1 \times 10^9$ Ohm resistor load) with the curve. Both of these situations may be observed with reference to FIG. 7. First, the characteristic curvature nearest the origin prevents $V_{ON}$ from being less than about 25 to 45 volts. Second, after this transistor has been electrostatically stressed by the large drain field, its characteristics are represented by the curve B, shifted to the right, as shown in phantom line. This further increases $V_{ON}$. This latter effect is termed the $V_x$ shift because the $V_x$ differential ($V_{x2}-V_{x1}$) is an indication of the extent of curve shifting. As will be seen, the present invention ameliorates both of these situations, thereby improving the transistor's $V_{ON}$ and stabilizing the transistor.

The $V_x$ shift phenomenon will now be described in further detail, and an hypothesis will be proposed, representing the best present thinking explaining the causes of the problem and the curative effects of the addition of a continuously biased secondary gate. During the OFF state of the FIG. 1 type of high voltage transistor, i.e. when high voltage is applied to the drain while the gate is held at a low potential, a severe electrostatic stress condition exists. No electrons can flow into the dead region and any free electrons in the dead region are swept out by the large drain field, resulting in a severe depletion of carriers from the dead region of the amorphous silicon charge transport layer. When depleted of electrons by this electrostatic stress, the Fermi level is pulled down toward the valence band. In order to equilibrate from this depletion condition, the material generates new defects, or traps, to bring the Fermi level back up to mid-gap. The larger number of traps hold more electrons and prevent their movement through the material until the field is increased to a level high enough to move them out into the conduction band. Therefore, this extra set of defects reduces current output for a given drain potential when the stress condition is removed, by the device being switched to its ON state, and causes the $V_x$ shift. An increase in localized states is particularly acute at the boundary between the gated and "dead" regions because, in addition to the lateral field causing depletion, there is also a small normal field (the first gate is usually at a slight potential) and these fields produce a potential barrier inhibiting injection of charge carriers into the "dead" region. Since this $V_x$ shift is predicated upon the phenomenon of equilibration, it will occur in amorphous silicon but will not occur in crystalline silicon which does not exhibit this phenomenon. In summary, it is believed that depletion of carriers causes the $V_x$ shift and that prevention of depletion will inhibit the $V_x$ shift.

Turning to FIG. 2 there is shown one form of a high voltage thin film transistor modified in accordance with the present invention so as to substantially eliminate the deleterious $V_x$ shift. For ease of understanding, similar elements are numbered with the same numerals, as used in describing the FIG. 1 device, with the addition of a prime ('). There is provided a first gate electrode 12' over which there is a first gate dielectric 14' and an amorphous silicon charge transport layer 16'. A source electrode 18' and a drain electrode 20' are in intimate contact with the layer 18', and a second gate dielectric layer 22 overlies the source and drain electrodes and bears a second gate 24 thereon. As viewed in the drawing, the left edge of second gate 24 overlaps the right edge of the first gate 12' while the right edge of the second gate extends toward the drain 20', and is spaced therefrom.

It is well understood that the effect of each gate is to induce an accumulation channel in the charge transport layer, so that the second gate 24 reduces the length of the dead region (identified as $L_2$ in FIG. 1) to a length $L_3$, through which space charge limited current passes. While the potential applied to the first gate electrode 12' is varied to turn the transistor ON and OFF, the potential on the second gate 24 is usually constantly applied. Thus, the accumulation channel 26 cycles ON and OFF and the accumulation channel 28 is usually always ON. Furthermore, the accumulation channel 26, adjacent the charge transport layer interface with the first gate electrode 12', is more heavily accumulated than the accumulation channel 28, adjacent the charge transport layer interface with the second gate electrode 24 (as indicated by the relative thickness of the lines representing them). By selecting the thickness of the second dielectric 22 and the potential applied to the second gate electrode 24 it is possible to induce sufficient electrons into the weakly accumulated channel 28 to prevent depletion but not enough to heavily accumulate the channel. The significance of weakly accumulating channel 28 can be seen in FIG. 3 which is a graphical representation of the potential across the transistor of FIG. 2 in its OFF state. It should be noted that when the second gate electrode is weakly accumulated the potential drops smoothly (solid line) from the drain potential to the first gate potential, whereas there are steep voltage drops (dotted line) when the second gate is heavily accumulated. These steep voltage drops present areas of high field where dielectric breakdown is likely, and care must be taken to prevent it, particularly in the regions between the drain electrode and the second gate electrode and between the second and first gate electrodes. An example of parameters which have been found to be satisfactory with respect to the structure of FIG. 2 is: the first gate dielectric comprises 350 nm of amorphous silicon nitride and the potential on the first gate electrode varies from 0 volts to 24 volts; the second gate dielectric is 150 nm of silicon nitride and 1 μm of polyimide, and the potential on the second gate is maintained at 50 volts.

Although the potential applied to the second gate electrode is usually constant, there is a circuit application where this potential may be time variable as is the first gate electrode. In this case, deep depletion is prevented by fixing the second gate potential to be a given voltage above that of the first gate potential.

Figure 5:
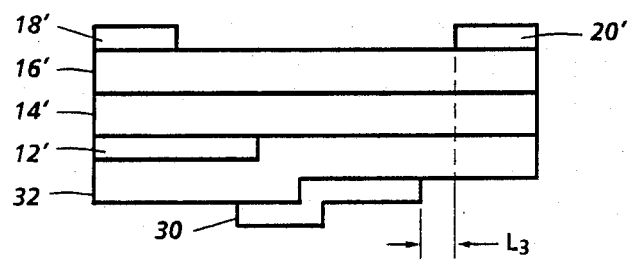
Figure 6:
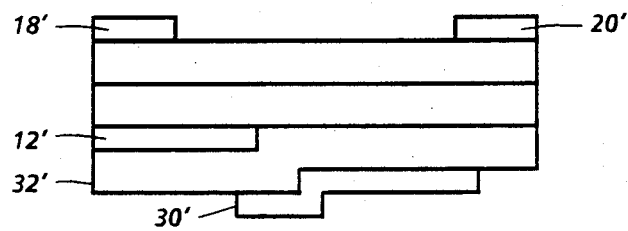

It is possible, as shown in the embodiment of FIG. 4, to extend the second gate 24' so that its right edge overlaps the drain electrode 20', thus eliminating the dead region, but such a construction is generally less desirable from a circuit standpoint, because capacitive effects induced thereby would slow the circuit response. In an alternative configuration, illustrated in FIG. 5, a second gate 30 and second gate dielectric 32 would be deposited directly upon the substrate, prior to fabricating the high voltage thin film transistor in the manner described with regard to FIG. 1. Another alternative construction is illustrated in FIG. 6, wherein the FIG. 5 configuration has been modified in a manner similar to that described and shown relative to FIG. 4, namely, the second gate 30' may be extended to overlap the drain electrode 32'.

The modified high voltage thin film transistor device of this invention, in all its forms, including a second gate with a continuously applied potential, causes charges to be induced at the interface between the charge transport layer and the second dielectric and holds them in place regardless of the condition of the first gate. Thus, it prevents the amorphous silicon layer from going into deep depletion, holds the density of states constant despite the imposition of the large lateral electrostatic field from the drain electrode, and results in inhibition of the $V_x$ shift.

As set forth above, it is the intent of this invention to stabilize the high voltage thin film transistor of FIG. 1 and to lower $V_{ON}$. The addition of the second gate electrode achieves these results as can be seen in FIG. 7. Curve C is representative of the initial condition of the devices of FIGS. 2 through 5, and curve D is representative of an after stress condition thereof. The $V_x$ shift is substantially eliminated, and the space charge limited current is greatly increased, thereby shifting the curve so that it rises more steeply near the origin. This is due to the $1/L^7$ relationship of space charge limited current to the length of the dead region. Since the secondary gate has made the dead region shorter ($L_3$) the current rises dramatically and lowers the transistor's $V_{ON}$ to desirable values.

Although this disclosure has concentrated upon the amorphous silicon embodiment of the high voltage transistor, it should be appreciated that other amorphous semiconductor charge layers would exhibit similar improvements. Furthermore, it has been observed that polysilicon thin film high voltage transistors also are benefited by the addition of a second gate opposite the offset ($L_2$) region. While the effect of depletion caused generation of defects in the charge transport layer is minimal, as compared to the amorphous semiconductor layer, there is a significant shifting of its characteristic $I_{DS}$ vs. $V_{DS}$ curve to lower $V_{ON}$, due to enhancement of conductivity by the second gate, which increases the drain current.

It should be understood that the present disclosure has been made only by way of example and that numerous other changes in details of construction and the combination and arrangement of elements may be resorted to without departing from the true spirit and scope of the invention as hereinafter claimed.

What is claimed:

1. A high voltage thin film transistor comprising a non-single crystal semiconductor charge transport layer, laterally disposed source and drain electrodes located adjacent to one surface of said charge transport layer, means for applying a constant high electrical potential to said drain electrode, a first gate dielectric layer located adjacent to an opposite surface of said charge transport layer, a first gate electrode separated from said opposite surface of said charge transport layer by said first gate dielectric layer, said first gate electrode having one edge laterally overlapping said source electrode and another edge laterally spaced from said drain electrode, and means for applying an electrical potential to said first gate electrode in a time varying manner so as to form a first accumulation channel of a given conductivity type periodically opposite to said first gate electrode in said charge transport layer, said transistor being characterized by including second gate electrode means for forming a second accumulation channel extending laterally from said first accumulation channel toward said drain electrode, said second accumulation channel of said given conductivity type being less accumulated than said first accumulation channel, and means for applying an electrical potential to said second gate electrode means for preventing depletion of charge carriers within said second accumulation channel.

2. The high voltage thin film transistor as defined in claim 1 characterized in that said charge transport layer comprises an amorphous semiconductor material.

3. The high voltage thin film transistor as defined in claim 2 characterized in that said charge transport layer comprises amorphous silicon.

4. The high voltage thin film transistor as defined in claim 1 characterized in that said charge transport layer comprises a polycrystalline semiconductor material.

5. The high voltage thin film transistor as defined in claim 4 characterized in that said charge transport layer comprises polycrystalline silicon.

6. The high voltage thin film transistor as defined in either claim 1 characterized in that said means for applying an electrical potential to said second gate electrode means applies a constant potential thereto.

7. The high voltage thin film transistor as defined in claim 1, 2 or 6 characterized in that said second gate electrode means is located on the same side of said charge transport layer as said source and drain electrodes.

8. The high voltage thin film transistor as defined in claim 1, 2 or 6 characterized in that said second gate electrode means comprises a second gate dielectric layer and a second gate electrode, and wherein said second gate dielectric layer is disposed adjacent to said charge transport layer and lies between said second gate electrode and said charge transport layer.

9. The high voltage thin film transistor as defined in claim 8 characterized in that said second gate electrode has one edge laterally overlapping said first gate electrode and another edge laterally spaced from said drain electrode by a second distance.

10. The high voltage thin film transistor as defined in claim 8 characterized in that said second gate electrode has one edge laterally overlapping said first gate electrode and another edge laterally overlapping said drain electrode by a second distance.

11. The high voltage thin film transistor as defined in claim 1, 2 or 6 characterized in that said second gate electrode means is located on the same side of said charge transport layer as said first gate dielectric layer and said first gate electrode.

12. The high voltage thin film transistor as defined in claim 1, 2 or 6 characterized in that said second gate electrode means comprises a second gate dielectric layer and a second gate electrode, and wherein said second gate dielectric layer is disposed adjacent to said first gate electrode and said first gate dielectric layer, and lies between said second gate electrode and said first gate dielectric layer.

13. The high voltage thin film transistor as defined in claim 12 characterized in that said second gate electrode has one edge laterally overlapping said first gate electrode and another edge laterally spaced from said drain electrode by a second distance.

14. The high voltage thin film transistor as defined in claim 12 characterized in that said second gate electrode has one edge laterally overlapping said first gate electrode and another edge laterally overlapping said drain electrode by a second distance.

15. The high voltage thin film transistor as defined in claim 1, 2 or 6 characterized in that said second accumulation layer is more weakly accumulated than said first accumulation layer.

* * * * *